United States Patent [19]
Ohta et al.

[11] Patent Number: 4,563,651
[45] Date of Patent: Jan. 7, 1986

[54] FM DEMODULATOR WITH VARIABLE BANDPASS FILTER

[75] Inventors: Tomozo Ohta; Yoshio Tsutsumi; Yoshihiro Konishi, all of Tokyo, Japan

[73] Assignee: Oki Electric Industry Co., Ltd., Tokyo, Japan

[21] Appl. No.: 370,795

[22] Filed: Apr. 22, 1982

[30] Foreign Application Priority Data

Apr. 28, 1981 [JP] Japan ................................. 56-63384
Apr. 28, 1981 [JP] Japan ................................. 56-63385

[51] Int. Cl.[4] ........................................... H03D 3/00
[52] U.S. Cl. .................................. 329/110; 329/136; 329/139; 455/266
[58] Field of Search ............... 329/110, 136, 137, 139, 329/140; 358/36, 37, 38, 167, 166; 455/266

[56] References Cited

U.S. PATENT DOCUMENTS

| | | | |
|---|---|---|---|
| 4,326,297 | 4/1982 | Sato et al. | 455/266 X |
| 4,339,828 | 7/1982 | Chasek | 455/266 X |
| 4,342,000 | 7/1982 | Ogita | 329/139 X |
| 4,356,568 | 10/1982 | Ogita et al. | 455/266 X |

FOREIGN PATENT DOCUMENTS

57-93704  6/1982  Japan ................................. 329/110
853960  11/1960  United Kingdom.

OTHER PUBLICATIONS

Van Dasler, G. et al., "A Threshold Extension Demodulator", Phillips Telecommunication Review, vol. 31, No. 3, pp. 131–147 (Oct. 1973).

*Primary Examiner*—Eugene R. LaRoche
*Assistant Examiner*—Robert J. Pascal
*Attorney, Agent, or Firm*—Martin M. Novack

[57] ABSTRACT

The threshold level for demodulating an FM signal, for instance a television picture signal, has been improved or lowered by adaptively restricting the bandwidth of the signal using an adaptive bandpass filter, and therefore, the picture quality and/or S/N ratio of the demodulated television signal has been improved. The adaptive bandpass filter has enough bandwidth when the signal level is sufficiently higher than the threshold level, but is narrow when the signal level is close to or lower than the threshold level. The bandwidth of the adaptive bandpass filter is adjusted according to the total power of the input FM signal and C/N (the carrier signal to noise) ratio. The improvement of the threshold level is almost 2 dB.

9 Claims, 20 Drawing Figures

4,563,651

FM DEMODULATOR WITH VARIABLE BANDPASS FILTER

BACKGROUND OF THE INVENTION

The present invention relates to an FM signal demodulation system and, in particular, relates to such a system which improves the noise characteristics of the demodulated signal in a frequency modulation (FM) signal.

A prior FM signal demodulation circuit is a frequency demodulation circuit having an inductance (L) and a capacitance (C), or a delay line. In such case, the relationship of the signal-to-noise ratio (S/N) of the demodulated signal for the ratio (C/N) in which C is the carrier signal power and N is the thermal noise power, of an input signal is:

$$S/N = C/N(FI)$$

where FI is a constant. Therefore in general, the value S/N is proportional to C/N. However, when the value C/N is less than a predetermined threshold level, the above equation is not satisfied, and the value S/N deteriorates considerably. That threshold level is usually approximately 10 dB. In order to improve the value C/N, a bandpass filter is utilized at the input of the demodulator in order to restrict the bandwidth of the input signal and the thermal noise.

In a television signal transmission system through a satellite relay system, an FM (Frequency Modulation) system has been used. The reception signal level in a satellite communication system is usually around the threshold level, due to the restriction of the transmission power of a satellite, the attenuation and/or stability of a transmission path, and/or the apparatus of an earth station. Accordingly, when the reception signal level is decreased a little for some reason, that signal level becomes lower than the threshold level, and then, the picture quality of a television signal is considerably deteriorated by spike noise which is peculiar to a television transmission, and/or it becomes even impossible to reproduce a picture signal.

Accordingly, it would be desirable to decrease the influence of the spike noise, and/or the decrease of the reception level of a television signal, in order to improve picture quality. In particular, in the case of a direct satellite broadcasting system in which a satellite transmitter sends a picture signal directly to consumer television reception sets, the improvement of noise characteristics is very important.

SUMMARY OF THE INVENTION

It is an object, therefore, of the present invention to overcome the disadvantages and limitations of a prior FM signal demodulation system by providing a new and improved FM signal demodulation system.

It is also an object of the present invention to provide an FM signal demodulation system for a television picture signal transmitted through a satellite relay system, for improving a signal-to-noise ratio, and/or the threshold level for the demodulation.

The above and other objects are attained by an FM signal demodulation system comprising (a) an input terminal for accepting an FM signal; (b) detection means for detecting information relating to a signal level at said input terminal; (c) an adaptive bandpass filter coupled with said input terminal for restricting bandwidth of said FM signal; (d) a discriminator coupled with output of said adaptive bandpass filter for demodulating FM signal; (e) an output terminal coupled with said discriminator for providing a demodulated signal; and (f) the bandwidth of said adaptive bandpass filter being controlled according to the signal level detected by said detection means so that said bandwidth is narrow when the signal level is low, and said bandwidth is wide when the signal level is high.

In a preferred embodiment, said detection means detects the level of the color sub-carrier component of a television signal.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
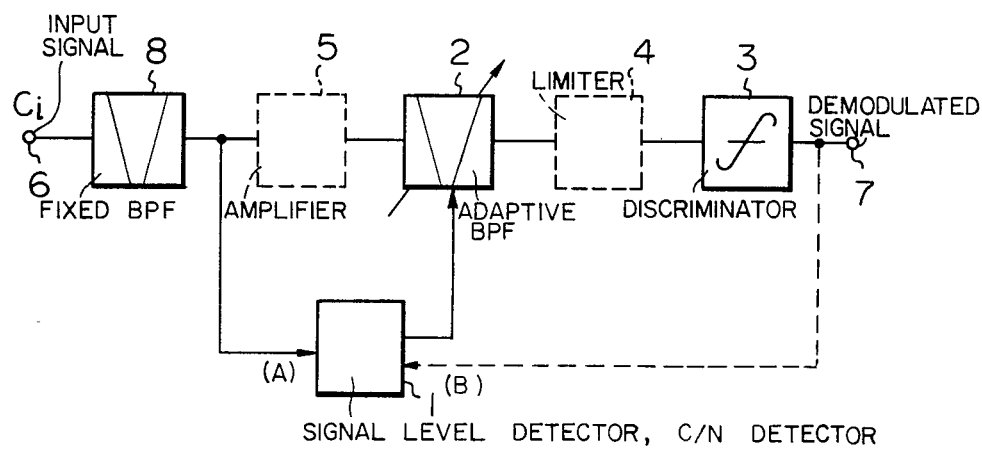
FIG. 1 is a block diagram of an FM signal demodulation system according to the present invention.

FIG. 1 is the block diagram of a reception system according to the present FM signal demodulation system. In the figure, the reference numeral 1 is a signal level detector or C/N detector which detects the signal level of a television signal. In the embodiment, the signal level is detected in an intermediate frequency (IF) portion, which is before the demodulation. The reference numeral 2 is a variable or adaptive bandpass filter, the bandwidth of which is adjustable, 3 is a frequency discriminator having an inductance (L) and a capacitance (C), or a delay line, for demodulating an FM signal, the reference numerals 4 and 5 show circuits including an amplifier, an amplitude limiter, etc, 6 is an input terminal of an FM signal, 7 is an output terminal for providing demodulated television signal, 8 is a reference bandpass filter having the fixed bandwidth ($B_0$). It is assumed that the input signal to the input terminal 6 is in the intermediate frequency range (70 MHz through 140 MHz), and that signal is frequency converted from high frequency from a satellite station in an external circuit (not shown).

In FIG. 1, an input signal $C_i$ at the input terminal 6 is applied to the reference bandpass filter 8 which has the fixed bandwidth $B_0$, then, the bandwidth of the input signal $C_i$ is restricted by the filter 8, and some noise energy is deleted.

The output of the bandpass filter 8 is applied to the signal level detector 1, and the adaptive bandpass filter 2 through the circuit 5. The signal level detector 1 detects the level of the signal, or the value C/N at the output of the bandpass filter 8.

The bandwidth of the adaptive bandpass filter 2 is controlled according to the signal level detected by the signal level detector 1, so that the bandwidth becomes narrow when the signal level is around or lower than the threshold level, according to the modulation index of some component of a television signal. Thus, the bandwidth of a television signal is determined by the bandwidth of the adaptive bandpass filter 2. The output of the adaptive bandpass filter 2 is applied to the discriminator 3 through the circuit 4, and then, the demodulated television signal is applied to the output terminal 7. The signal level detector 1 controls the bandwidth of the filter 2, for instance, according to the signal power of the total television signal power, or some noise component.

The bandwidth $B_0$ of a reception system is determined as follows:

$$B_0 = 2(\Delta f + f_h)$$

in order to obtain the enough energy of the modulated signal, and keep the distortion of the demodulated signal to the desired low level, where $\Delta f$ is the highest frequency shift of an input television signal, and $f_h$ is the highest modulation frequency of the television signal. It should be appreciated that the bandwidth is a little wider than that value $B_0$, considering the fluctuation of a carrier frequency.

The value C/N (ratio of the carrier power to the noise power) in this case is $C_i/(kB_0)$ at the input of the discriminator 3, where k is a constant.

If there is no adaptive bandpass filter 2, or the bandwidth of said adaptive bandpass filter 2 is wider than that of the reference bandpass filter 8, the circuit of FIG. 1 operates similar to a conventional FM demodulation system.

Figure 2:
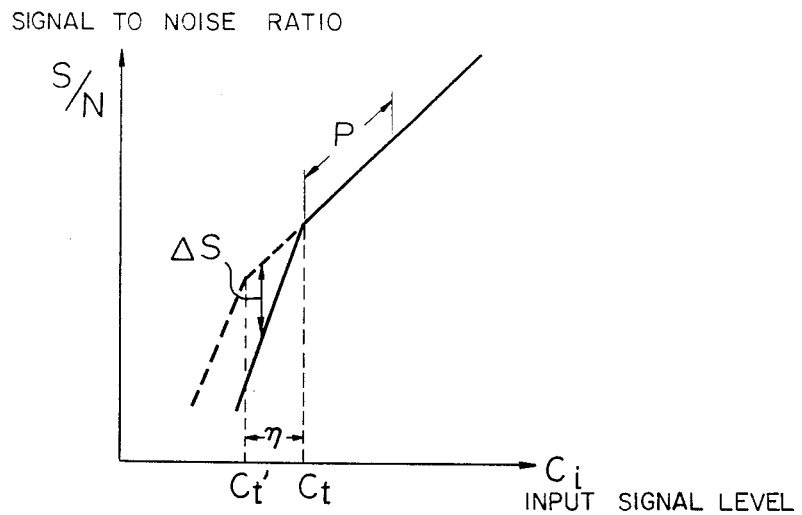
FIG. 2 is a curve between input signal level and S/N of demodulated signal.

FIG. 2 shows the relation between the input carrier level $C_i$ and the value S/N of the demodulated signal, and it should be noted in FIG. 2 that the value S/N is deteriorated as the value $C_i$ is decreased, and when the value $C_i$ is decreased lower than the threshold level ($C_i = C_t$), the value S/N is decreased rapidly. The threshold level corresponds approximately to C/N = 10 dB.

In a usual reception operation, the reception signal level is higher than that threshold level $C_t$ by several dB, and is in the range shown by the symbol P in FIG. 2. In this case, the value S/N is obtained by the equation below:

$$S/N = (3/2)(\Delta f/f_h)^2(B_0/f_h)(C_i/N)$$

where $N = kB_0$, and k is a constant. In some circumstances, the carrier level $C_i$ is decreased lower than that threshold level $C_t$, and that situation occurs often when a communication apparatus is simple.

When the carrier level $C_i$ is higher than the threshold level $C_t$, the picture quality of a television picture which is transmitted through an FM system, depends upon thermal noise, nonlinear distortion of a reception system, and bandwidth $B_0$ of the demodulation system. When the bandwidth $B_0$ is narrow, thermal noise is decreased, but the distortion is increased.

On the other hand, when the carrier level $C_i$ is the same as or lower than the threshold level $C_t$, and the bandwidth $B_0$ is approximately $2(\Delta f + f_h)$, the picture quality is influenced more by the thermal noise, but is less influenced by the non-linear distortion. The deterioration of picture quality by the non-linear distortion is masked by the deterioration caused by the thermal noise. When the carrier level $C_i$ is lower than the threshold level, the picture quality is deteriorated suddenly, and a picture is almost not recognizable because of the spike noise. Therefore, when the carrier level is equal to or lower than the threshold level, the picture quality depends upon the thermal noise, and if the thermal noise characteristics are improved, the picture quality is improved considerably.

The present invention improves the ratio C/N of the input signal to a discriminator by controlling an adaptive bandpass filter, and improves the picture quality of a television signal.

Now, the present invention is described theoretically in more detail.

It is assumed that the highest modulation frequency $f'_h$, is modulated with the highest frequency shift $\Delta f$ through the FM modulation system. The modulation index $m_f$ is $m_f = \Delta f/f'_h$. It is assumed that the reference bandpass filter 8 has the bandwidth $B_0 = 2(\Delta f + f'_h)$, and that the bandpass filter has the flat characteristics in the pass band and the infinite attenuation out of the passband as shown by the curve (a) in FIG. 3. The signal power $P_0$ at the input of the reference bandpass filter of the FM signal which is modulated by the frequency $f'_h$ is shown below:

$$P_0 = \sum_{p=-n}^{n} J_p^2(m_f) = J_0^2(m_f) + 2J_1^2(m_f) + 2J_2^2(m_f) + \ldots \quad (1)$$

where $J_i(m_f)$ means a Bessel function. The reference bandpass filter restricts the bandwidth to $B_0$, and therefore, the component satisfying $nf'_h < B_0/2$ is transmitted and appears at the output of the reference bandpass filter. The output power of the bandpass filter is designated $P'_0$.

On the other hand, the noise power $N_0$ of the reference bandpass filter 8 is proportional to the bandwidth, and is expressed below:

$$N_0 = kB_0 \quad (2)$$

where k is a constant. Therefore, the ratio C/N at the output of the reference bandpass filter is:

$$C/N = P'_0/N_0$$

Figure 3:
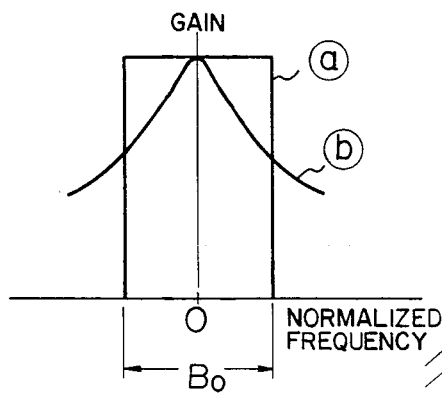
FIG. 3 shows typical characteristics of an adaptive bandpass filter for the explanation of the operation of the present invention.

Next, the adaptive bandpass filter 2 has the power transfer function T(f), and the symmetrical passband characteristics as shown by the symbol (b) in FIG. 3. The horizontal axis in FIG. 3 is the normalized frequency in which the difference from the center frequency is shown, and $T(0)=1$ is satisfied at $f=0$.

The output signal power $P_T$ of the adaptive bandpass filter 2 is shown below:

$$P_T = \sum_{p=-n}^{n} J_p^2(m_f) T(pf_h') \quad (3)$$

$$= J_0^2(m_f) + 2J_1^2(m_f)T(f_h') + 2J_2^2(m_f)T(2f_h') + \ldots + 2J_n^2(m_f)T(nf_h')$$

where $nf_h < B_0/2$ is satisfied.

Further, the noise power at the output of the adaptive bandpass filter 2 is shown:

$$N_T = 2 \int_0^{B_0/2} T(f) df \quad (4)$$

Accordingly, the ratio C/N at the output of the adaptive bandpass filter 2 is:

$$C/N = P_T/N_T$$

According to the present invention, when the input signal level is sufficiently high, only the reference bandpass filter 8 restricts the bandwidth of the reception signal to $B_0$. When the input signal level decreases, and the carrier-to-noise ratio $C/N(=P'_0/N_0)$ at the output of the reference bandpass filter 8 closes to the threshold level, the adaptive bandpass filter 2 is controlled to have the particular transfer function T(f), and satisfy the inequality below.

$$P_T/N_T > P'_0/N_0 \quad (5)$$

In this case, the threshold level is improved by $\eta$:

$$\eta = P_T/N_T(N_0/P'_0) \quad (6)$$

Then, the threshold $C_t$ in FIG. 2 is improved to $C'_t$, and the signal-to-noise ratio S/N of the demodulated signal is also improved by $\Delta S$. The effect of the improvement of picture quality is considerably large, since the deterioration of the picture quality is large when the signal level is less than the threshold level $C_t$. According to the present invention, a spike noise on a television screen decreases considerably, and an excellent picture quality is obtained.

Next, the improvement of a commercial television signal is described in detail.

It is assumed that a color television signal has a frequency shift up to 6 MHz, and the emphasis system recommended by CCIR. REC. 405-1 is used. The picture signal processed by a pre-emphasis circuit in a transmit side has the power weights of about $-10$ dB for a low frequency component, and about $+3$ dB for a high frequency component. Therefore, it is enough to analyze the color sub-carrier component (3.58 MHz) as the modulation signal having the highest frequency shift in a television signal.

A color bar signal in a standard test pattern has the frequency shift 6 MHz (modulation frequency is 3.58 MHz), when a pre-emphasis is utilized. The frequency shift by other picture components is considerably small as compared with that value.

The highest modulation index $m_f$ for that color bar signal is:

$$m_f = 6/3.58 = 1.67$$

The bandwidth $B_0$ of the reference bandpass filter 8 is determined to be:

$$B_0 = 2(6+4.2) = 20.4 \text{ MHz}$$

The output signal $P'_0$ of the reference bandpass filter 8 is shown:

$$P'_0 = J_0^2(m_f) + 2J_1^2(m_f) + 2J_2^2(m_f) \quad (7)$$
$$= 0.172 + 0.663 + 0.150 = 0.985$$

The first term of the equation (7) shows the center frequency component (carrier component) of an FM signal, the second term of the equation (7) shows the first sideband component which is separated by 3.58 MHz from the center frequency, and the third term shows the second sideband component which is separated by 7.16 MHz from the center frequency.

On the other hand, the noise power $N_0$ at the output of the reference bandpass filter is shown below:

$$N_0 = B_0 = 20.4 \quad (8)$$

where the noise power density is normalized by 1/MHz. Accordingly, $$P'_0/N_0 = 0.985/20.4 \quad (9)$$

Figure 4:
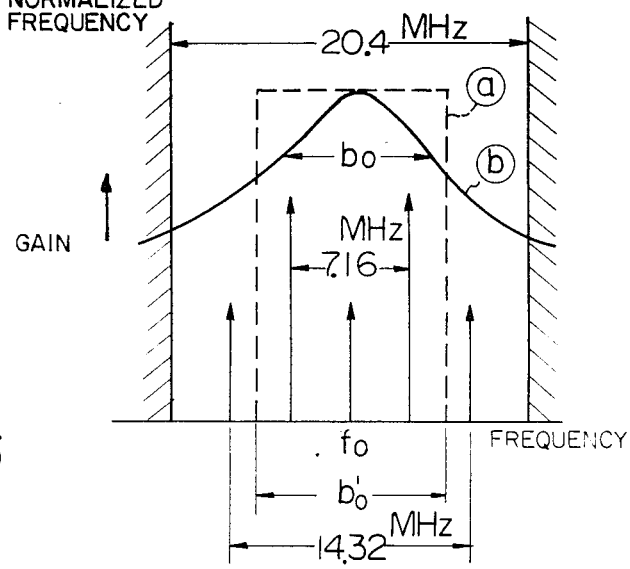
FIG. 4 is also an explanatory drawing of the operation of the present invention.

The spectrum of a television signal with the above analysis is shown in FIG. 4.

Next, it is assumed that the adaptive bandpass filter 2 has the characteristics as shown by the curve (a) which has the narrow passband b' and infinite attenuation outside of the passband. In this case, the ratio of $P_T$ (signal power) to $N_T$ (noise power), and the improvement ($\eta$) of C/N at the output of the adaptive bandpass filter are shown below.

(1) when $14.32 < b < 20.4$:

$$P_T/N_T = 0.985/b$$

$$1 < \eta < 1.42$$
$$(1.5 \text{ dB})$$

(2) when $7.16 < b < 14.32$ is satisfied:

$$1.20 < \eta < 2.41$$
$$(0.8 \text{ dB}) \quad (3.8 \text{ dB})$$

(3) when $b < 7.16$ is satisfied, the demodulation is impossible, since all the spectrum of a television signal is deleted.

Next, the case where the adaptive bandpass filter 2 has the characteristics shown by the curve (b) in FIG. 4 is described. The bandpass filter with the characteristics of the curve (b) is implemented by the circuit of FIG. 5, which has fixed inductance L, a fixed capacitor C and a variable resistor R. The r is the loss included in the capacitor C and the inductor L. The variable resistor R is implemented by a PIN diode, or a Schottky diode.

When an input signal level is high enough, the resistor R is controlled to be high enough, and therefore, the filter 2 does not operate on the input signal at all, and the bandwidth of the signal is merely restricted by the reference bandpass filter 8 to $B_0$.

Figure 5:
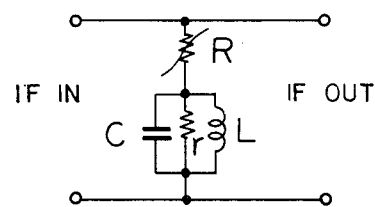
FIG. 5 is a circuit diagram of an adaptive bandpass filter according to the present invention.

As the input signal level is decreased, and the value C/N becomes close to the threshold level, the resistor R of the adaptive bandpass filter 2 is controlled to be low so that the adaptive bandpass filter 2 effects to the input signal. When the resistor R is adjusted properly, the transfer function T(f) of the single resonance circuit of FIG. 5 is approximately shown below:

$$T(f) = 1/(1 + (2f/b_0)^2) \qquad (10)$$

where $b_0$ is the bandwidth with the 3 dB level difference. The curve (b) in FIG. 4 shows the characteristics of the adaptive bandpass filter of FIG. 5. The signal power $P_T$ and the noise power $N_T$ at the output of the adaptive bandpass filter with the characteristics of the curve (b) are shown by the equations (11) and (12).

$$P_T = 0.172 + 0.663/(1 + (7.16/b_0)^2) + 0.150/(1 + (14.3 - 2/b_0)^2) \qquad (11)$$

$$N_T = 2 \int_0^{B_0/2} 1/(1 + (2f/b_0))df = b_0 \tan^{-1}(B_0/b_0) \qquad (12)$$

Since $B_0$ is 20.4 MHz, said $N_T$ is calculated as follows:

$$N_T = b_0 \tan^{-1}(20.4/b_0) \qquad (12)'$$

Accordingly, the improvement ($\eta$) of the ratio C/N by the adaptive bandpass filter is:

$$\eta = P_T/N_T(N_0/P_0) \qquad (13)$$

Figure 6:
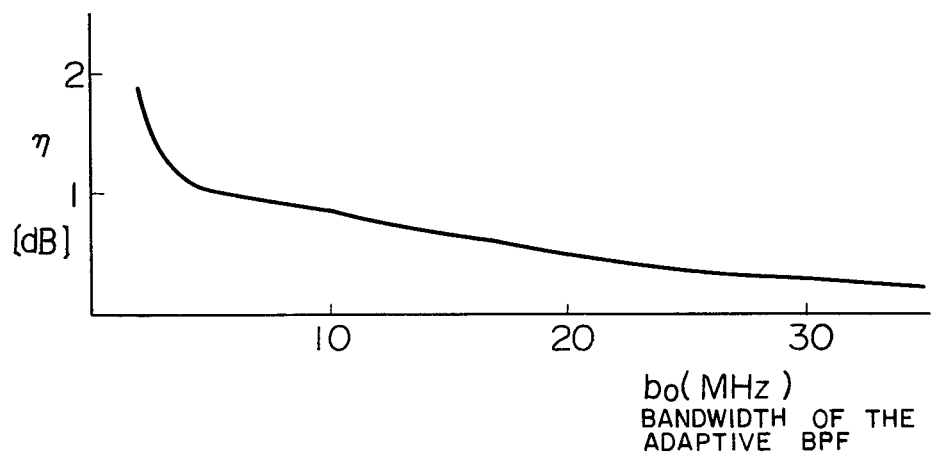
FIG. 6 is the curve showing the relation between the bandwidth of the adaptive bandpass filter and the improvement of the threshold level.

FIG. 6 shows the curve of ($\eta$) which is the improvement of the value C/N for the bandwidth $b_0$ with the 3 dB level difference. It should be noted in FIG. 6 that the value C/N is always improved for all the values $b_0$, by using a simple adaptive bandpass filter as shown in FIG. 5.

Usually, the amplitude of the color sub-carrier component of a color television signal is low, and in that case, the most power of the television signal modulated in an FM system is concentrated around the carrier frequency and within the first sidebands, and therefore, the present invention considerably improves the picture quality by deleting a noise power but maintaining the most power of the picture signal.

Figure 7:
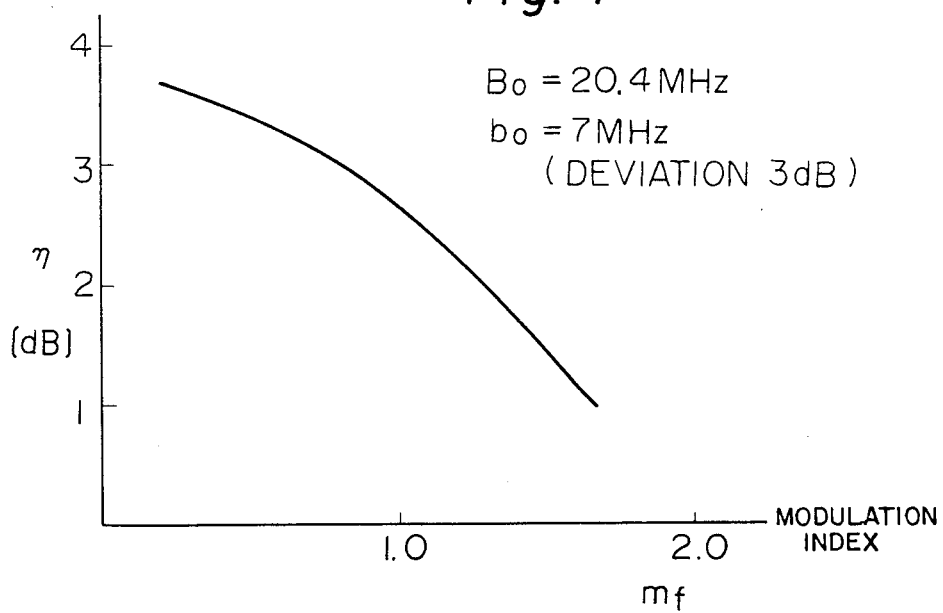
FIG. 7 is the curve showing the relation between the modulation index $m_f$ and the improvement of the threshold level.

FIG. 7 shows the curve between the modulation index $m_f$ of the color sub-carrier component and the improvement of the quality ($\eta$) when the bandwidth $b_0$ of the adaptive bandpass filter 2 is 7 Mhz.

Figure 8:
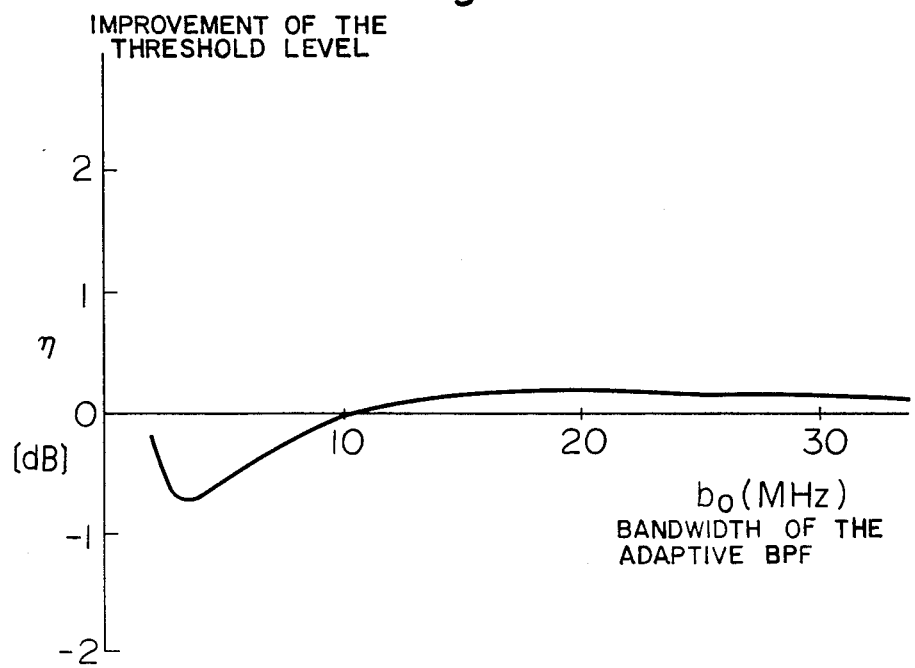
FIG. 8 is the curve showing the relation between the bandwidth of the adaptive bandpass filter and the improvement of the threshold level, in which no improvement is achieved.

Next, the satellite communication system in which the highest frequency shift is 10.75 MHz, and the highest modulation frequency is 4.2 MHz, is analyzed. In this case, an adaptive bandpass filter of FIG. 5 is utilized. In this case, the modulation index $m_f$ of the color sub-carrier component is $m_f = 10.75/3.58 = 3.0$, and the bandwidth $B_0$ of the reference bandpass filter is $B_0 = 2(10.75 + 4.2) = 29.9$ MHz. The improvement of ($\eta$) in this case is shown in FIG. 8, where the horizontal axis shows the bandwidth $b_0$ with the 3 dB difference of the adaptive bandpass filter. As apparent from FIG. 8, the value ($\eta$) is negative when the value $b_0$ is less than 10 MHz, and therefore, the value C/N is not improved in this case. The difference of FIG. 6 which improves the C/N, and FIG. 8 which does not improve the C/N comes from the relationship between the modulation index of a picture signal (in particular, the color sub-carrier component), and the bandwidth $b_0$ of the adaptive bandpass filter.

The present invention is effective, in particular, in a direct broadcasting satellite television system by using a simple adaptive bandpass filter as shown in FIG. 5, and the effectiveness of the present invention depends upon the relation between the modulation index ($m_f$) and the bandwidth of a filter.

Figure 9:
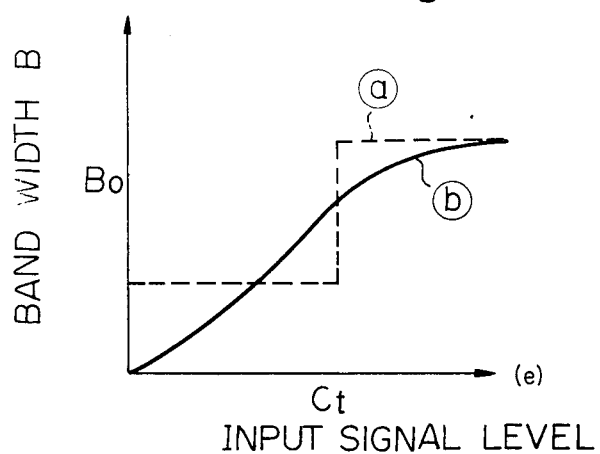
FIG. 9 shows some characteristics of the adaptive bandpass filter.

FIG. 9 shows the two curves of an adaptive bandpass filter 2. The curve (a) of FIG. 9 shows the case where the bandwidth $b_0$ of the adaptive bandpass filter changes suddenly when the input signal level crosses the threshold level $C_t$, and when the input level is higher than $C_t$, the bandwidth $b_0$ is wider than $B_0$, and when the input level is lower than $C_t$, the bandwidth $b_0$ is narrower than $B_0$. The curve (b) of FIG. 9 shows the case where the bandwidth of the adaptive bandpass filter changes with some slope with the change of the input signal level. Since a sudden change of the bandwidth might influence the distortion of the demodulated picture signal and/or the picture quality, the smooth curve (b) is preferable.

The slope of the curve (b) of FIG. 9, or the ratio of the change of the bandwidth $b_0$ for the change of the input signal level is designed according to the characteristics of the level detector (or the detector for detecting the value C/N), and the desired picture quality. The signal level for controlling the adaptive bandpass filter is derived, for instance, from an AGC control voltage (A) at the output of the reference bandpass filter 8, or some noise component (B) at the output of the discriminator 3.

In the above embodiment, the combination of the reference bandpass filter 8 and the adaptive bandpass filter 2 is described. Alternatively, said reference bandpass filter can be removed, and merely the adaptive bandpass filter can provide the effect of the present invention.

As described above, the present invention has a first reference bandpass filter which has a fixed bandwidth, and a second adaptive bandpass filter which has variable bandwidth. The bandwidth of the latter is wider when the input signal level is far higher than the threshold level, and narrower than the bandwidth $B_0$ of the reference bandpass filter when the input signal level is equal to or lower than the threshold level. The bandwidth of said adaptive bandpass filter is adjusted according to the total power of the input signal level itself, or some noise component of the output, stepwise or smoothly. Thus, the ratio C/N or S/N at the output of the adaptive bandpass filter is considerably improved, and then, the value S/N of the demodulated picture signal is improved. A spike noise which deteriorates picture quality is reduced, and the picture signal of a television signal is improved.

The present invention is useful in particular for a direct satellite broadcasting system, in which an input signal level to each receiver set is very low, by improving the value C/N.

Figure 10:
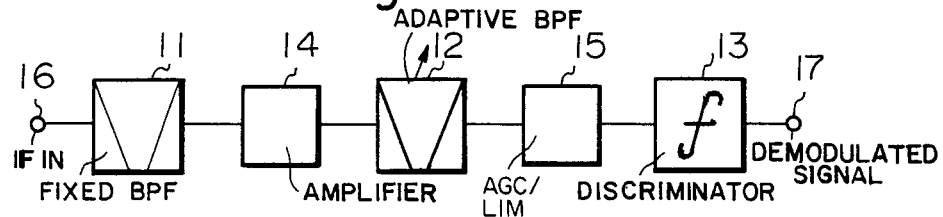
FIG. 10 is another block diagram of an FM signal demodulation system according to the present invention.

FIG. 10 is a block diagram of another embodiment of the present FM signal demodulation system, in which the reference numeral 11 is a reference bandpass filter having a fixed bandwidth, 12 is an adaptive bandpass filter having the variable bandwidth according to the input signal level, 13 is a discriminator for demodulating an FM signal, 14 is an amplifier, 15 is a circuit including an AGC amplifier and a limiter, 16 is an input terminal of an FM signal, and 17 is an output terminal of demodulated picture signal.

The feature of the embodiment of FIG. 10 is the structure of the adaptive bandpass filter 12, which adjusts the bandwidth of the same without external control signal.

Figure 11:
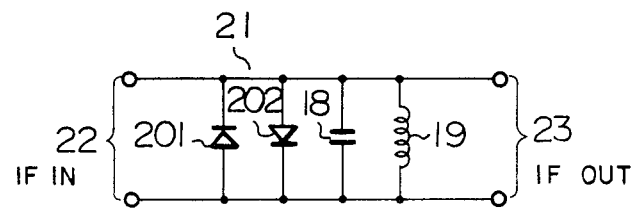
FIG. 11 is an adaptive bandpass filter for the use in the apparatus of FIG. 10, FIG. 12, FIG. 13, FIG. 14, FIG. 15 and FIG. 16 are explanatory drawings for the explanation of the operation of FIG. 10.

FIG. 11 is a circuit diagram of the adaptive bandpass filter 12 of FIG. 11, in which 18 is a capacitor, 19 is an inductor, 201 and 202 are non-linear elements like a diode, 21 is a signal line, 22 is an input terminal, and 23 is an output terminal of the adaptive bandpass filter. The resonant frequency of the tank circuit of the capacitor 18 and the inductor 19 is the same as the signal frequency.

Figure 12:
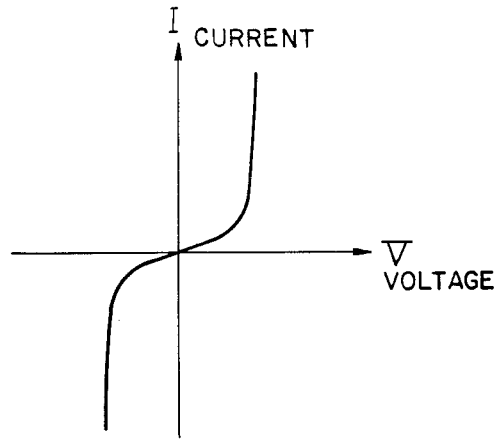
Figure 13:
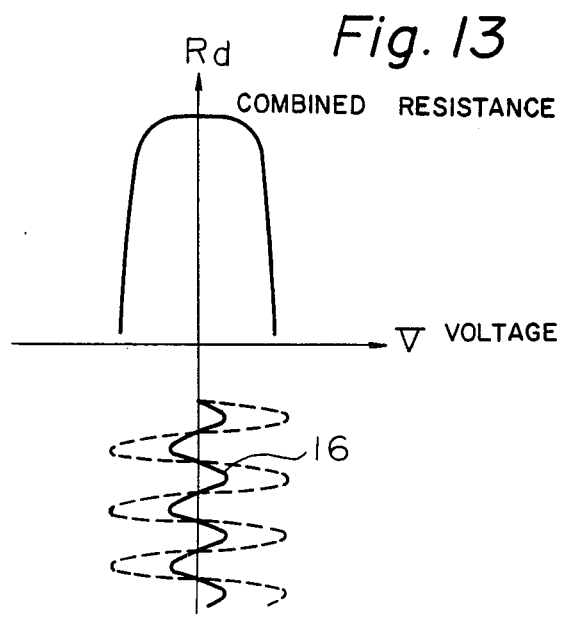

The parallel circuit of a pair of diodes 201 and 202 has the voltage-current characteristics as shown in FIG. 12, and when that curve of FIG. 12 is shown by the relationship between the input voltage V and the combined resistance $R_d$, the curve of FIG. 13 is obtained.

Figure 14:
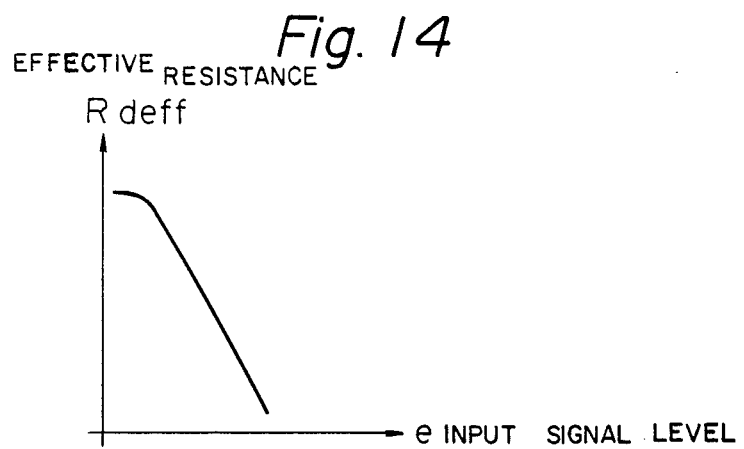
Figure 15:
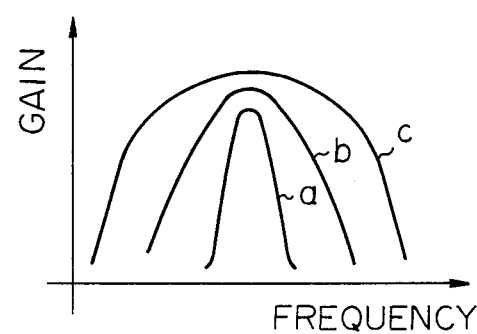
Figure 16:
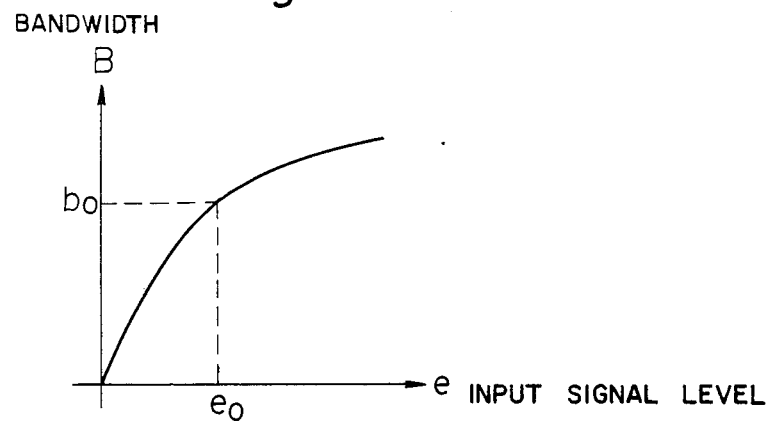

In FIG. 13, when the input signal level 16 of the high frequency is low, the diodes 201 and 202 have the high effective resistance $R_{deff}$, and when the input level 16 of the high frequency input signal is high, that effective resistance $R_{deff}$ decreases. Therefore, the relation between the effective resistance $R_{deff}$ and the input signal level (e) is shown in FIG. 14. By the way, the value Q of the parallel resonant circuit is:

$$Q = \omega_0 C R_{deff}$$

where C is the capacitance of the capacitor 18, and $\omega_0$ is the angular frequency. Accordingly, the value Q at the resonant frequency depends upon the input signal level. Therefore, the bandwidth of the bandpass filter 12 has the characteristics as shown in FIG. 15, in which the horizontal axis is the frequency and the vertical axis is the gain. The curve (a) shows the case where the input signal level (e) is low, the curve (b) shows the case where the input signal level (e) is intermediate, and the curve (c) shows the case where the input signal level (e) is high. The relationship between the input signal level (e) and the bandwidth $b_0$ is derived from FIG. 15, and is shown in FIG. 16.

It is assumed in FIG. 10 that the reference bandpass filter 11 has the bandwidth $B_0$, and the threshold level defined by said bandwidth $B_0$ is $e_0$. Then, the adaptive bandpass filter 12 is designed so that the bandwidth at the input signal level $e_0$ is $b_0$. Therefore, when the input signal level is higher than $e_0$, the bandwidth is $B_0$, and when the input signal level is lower than $e_0$, the bandwidth becomes narrower than $B_0$. Thus, the value C/N is improved when the input signal level is low.

Figure 17:
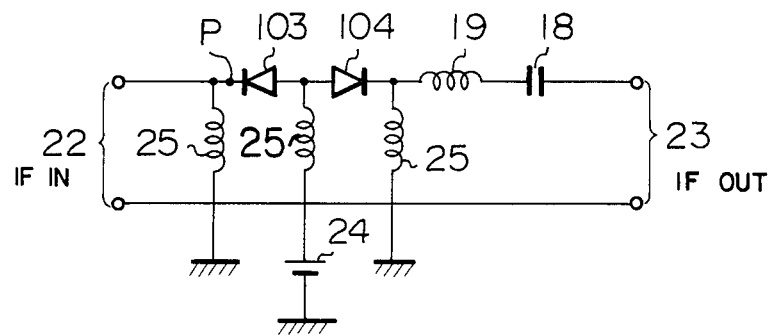
FIG. 17 is another embodiment of the adaptive bandpass filter for the use in the apparatus of FIG. 10, FIG. 18, FIG. 19 and FIG. 20 are explanatory drawings for the explanation of the operation of FIG. 17.

FIG. 17 is the modification of the adaptive bandpass filter 12 of FIG. 10, and the feature of FIG. 17 is that a serial resonant circuit is utilized, while the resonant circuit of FIG. 11 is a parallel resonant circuit. In FIG. 17, the reference numerals 103 and 104 are non-linear elements like diodes, 24 is a bias source for those diodes, numeral 25 indicates R.F. chokes for passing a direct (DC) bias voltage but preventing passage of a high frequency signal. Other numerals in FIG. 17 are the same as those of FIG. 11. The diodes 103 and 104 are inserted in the signal path, and are coupled with the opposite polarity as shown in FIG. 17 so that those diodes are biased in the forward direction by the bias source 24.

Figure 18:
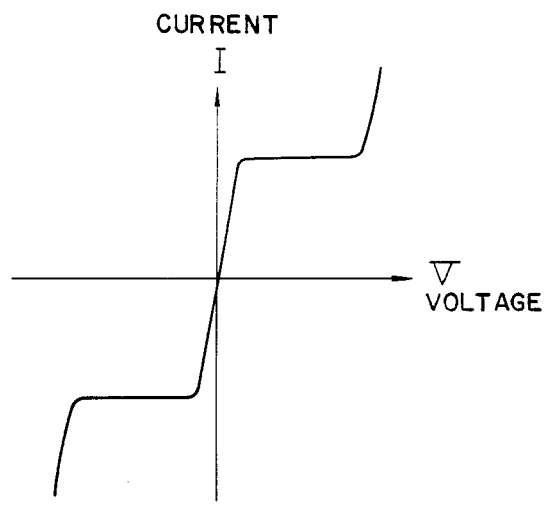
Figure 19:
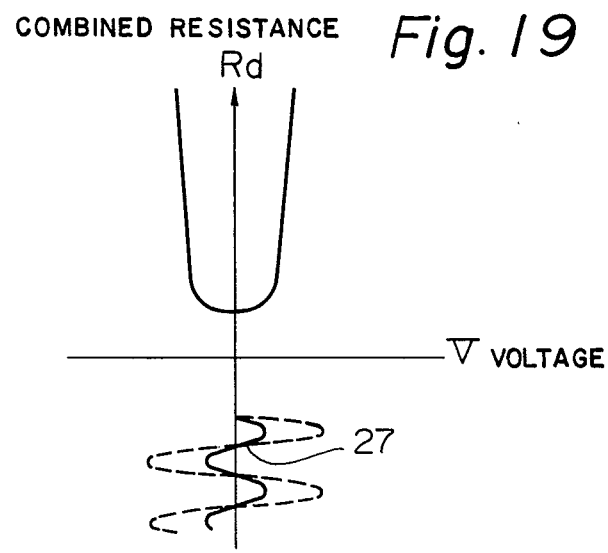

FIG. 18 shows the relationship between the voltage at the point P of FIG. 17 and the current I in the signal path. That relationship of FIG. 18 is defined by the characteristics of the diodes 103 and 104. Then, the relationship between the voltage and the effective resistance $R_{deff}$ is derived from FIG. 18, and is shown in FIG. 19. The input signal 27 is applied to those diodes 103 and 104 which have the characteristics of FIG. 19.

Figure 20:
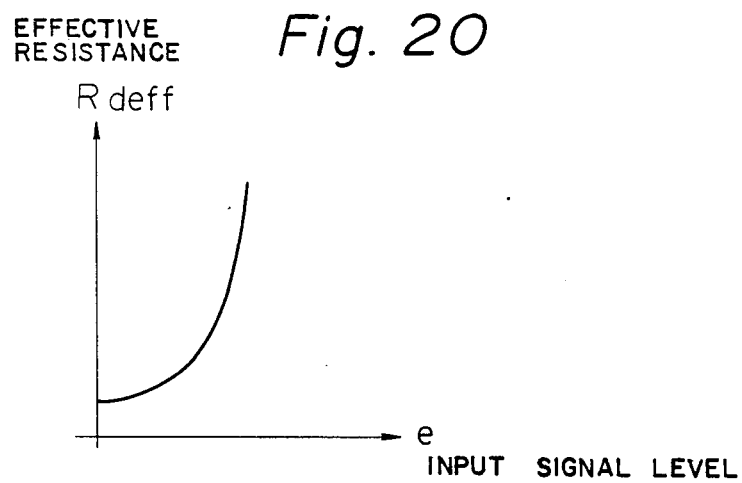

When the input signal level (e) is low, the diodes 103 and 104 have the low effective resistance $R_{deff}$, and when the input signal level (e) is high, the diodes 103 and 104 have the high effective resistance $R_{deff}$, as shown in FIG. 20.

In case of a serial resonant circuit, the value Q is shown below:

$$Q = \omega_0 L / R_{deff}$$

where L is an inductance of the coil 19 and other symbols show the same values as those of FIG. 11. Accordingly, when the input signal level (e) is low, the effective resistance $R_{deff}$ is small, and the value Q is large. While, when the input signal level (e) is high, the effective resistance $R_{deff}$ is large, and the value Q is small. Therefore, the value Q, or the bandwidth of the adaptive bandpass filter depends upon the input signal level.

It should be appreciated in the embodiments of FIGS. 11 and 17 that the bandwidth of the adaptive bandpass filter depends upon the input signal level. Therefore, an AGC circuit must not exist preceeding the adaptive bandpass filter 12 so that the change of the input signal level is directly applied to the adaptive bandpass filter.

From the foregoing it will now be apparent that a new and improved FM signal demodulation system has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. An FM signal demodulation system comprising:
    (a) an input terminal for obtaining an FM signal,
    (b) a reference bandpass filter having a fixed bandwidth, and having an input coupled to said input terminal,
    (c) detection means for detecting information relating to the signal level of the signal output from said reference bandpass filter,
    (d) an adaptive bandpass filter having an input coupled with the output of said reference bandpass filter for controlling the bandwidth of said FM signal,
    (e) a frequency discriminator coupled with the output of said adaptive bandpass filter for demodulating the FM signal,
    (f) an output terminal coupled with the output of the discriminator to provide a demodulated signal, the bandwidth of said adaptive bandpass filter being continuously controllable according to the output of said detection means so that said bandwidth becomes narrower as the signal level becomes lower, and said bandwidth becomes wider as the signal level becomes higher, the bandwidth of said adaptive bandpass filter being wider than that of said reference bandpass filter when the signal level is higher than a threshold level for demodulating an FM signal defined by the bandwidth of said reference bandpass filter, and the bandwidth of said adaptive bandpass filter being narrower than that of the reference bandpass filter when the signal level is lower than the threshold level.

2. An FM signal demodulation system according to claim 1, wherein said detection means detects the level of the total signal power of the output from said reference bandpass filter.

3. An FM signal demodulation system according to claim 1, wherein said detection means detects the noise component of the discriminator output.

4. An FM signal demodulation system according to claim 1, wherein said detection means detects signal-to-noise ratio of the demodulated signal at the output of said frequency discriminator.

5. An FM signal demodulation system according to claim 1, wherein said adaptive bandpass filter comprises a parallel circuit of an inductance and a capacitance, and a variable resistor coupled in series with said parallel circuit.

6. An FM signal demodulation system according to claim 1, wherein the transfer function T(f) of the adaptive bandpass filter satisfies the relationship:

$$P_0'/N_0 < P_T/N_T$$

where (a) $P_0'/N_0$ is the ratio of the modulation signal power $P_0'$ to the noise power $N_0$ at the output of the reference bandpass filter having the bandwidth $B_0$ and satisfies the relationship:

$$P_0'/N_0 = (J_0^2(m_f) + 2J_1^2(m_f) + 2J_2^2(m_f) + \ldots \\ 2J_n^2(m_f) + \ldots)/B_0$$

(b) $P_T/N_T$ is the ratio of the modulation signal power $P_T$ to the noise power $N_T$ at the output of the adaptive bandpass filter and satisfies the relationship:

$$P_T/N_T = \frac{(J_0^2(m_f) + 2J_1^2(m_f)T(f_v) + 2J_2^2(m_f)T(2f_v) + \ldots + 2J_n^2(m_f)T(nf_v) + \ldots)}{2\int_0^{B_0/2} T(f)df}$$

(c) $m_f$ is the modulation index and $m_f = \Delta f/f_v$ is satisfied;

(d) the bandwidth $B_0$ of the reference bandpass filter is approximately:

$$B_0 = 2(\Delta f + f_h)$$

(e) $nf_v < B_0/2$ is satisfied;

(f) $f_h$ is the highest modulation frequency, $f_v$ is the frequency of the color sub-carrier component, $\Delta f$ is the highest frequency shift, $J_n(m_f)$ is a Bessel function, $T(0) \geq 1$.

7. An FM signal demodulation system comprising:
(a) an input terminal for accepting an FM signal,
(b) a reference bandpass filter having an input coupled with said input terminal for defining the threshold level for modulation of the FM signal,
(c) an adaptive bandpass filter having an input coupled with the output of said reference bandpass filter, said adaptive bandpass filter having a bandwidth which is continuously controllable as determined by the signal level at the input of said adaptive bandpass filter, such that said bandwidth becomes narrower as said signal level becomes lower, and said bandwidth becomes wider as said signal level becomes higher,
(d) a discriminator coupled with the output of said adaptive bandpass filter for demodulating an FM signal,
(e) an output terminal coupled with the output of said discriminator for providing a demodulated signal, said adaptive bandpass filter having a wider bandwidth than that of said reference bandpass filter when the signal level is higher than the threshold level, and said adaptive bandpass filter having a narrower bandwidth than that of the reference bandpass filter when the signal level is lower than the threshold level.

8. An FM signal demodulation system according to claim 7, wherein said adaptive bandpass filter has a parallel resonant circuit in parallel with a pair of parallel diodes of opposite polarities.

9. An FM signal demodulation system according to claim 7, wherein said adaptive bandpass filter has a serial resonant circuit with a pair of diodes of opposite polarity in series therewith.

* * * * *